United States Patent
Chadda et al.

(10) Patent No.: US 6,849,547 B2
(45) Date of Patent: Feb. 1, 2005

(54) APPARATUS AND PROCESS FOR POLISHING A WORKPIECE

(75) Inventors: Saket Chadda, Chandler, AZ (US); Ismail Emesh, Gilbert, AZ (US); Brian L. Mueller, Chandler, AZ (US)

(73) Assignee: SpeedFam IPEC Corporation, Chandler, AZ (US)

( * ) Notice: Subject to any disclaimer, the term of this patent is extended or adjusted under 35 U.S.C. 154(b) by 0 days.

(21) Appl. No.: 09/826,674

(22) Filed: Apr. 5, 2001

(65) Prior Publication Data

US 2002/0146908 A1 Oct. 10, 2002

(51) Int. Cl.[7] .................. H01L 21/302; H01L 21/461
(52) U.S. Cl. .................. 438/691; 438/692; 438/693
(58) Field of Search ................. 438/690–693; 218/88, 89; 156/345.1, 345

(56) References Cited

U.S. PATENT DOCUMENTS

| | | | | |
|---|---|---|---|---|
| 5,246,525 A | * | 9/1993 | Sato ........................... | 156/345 |
| 5,830,806 A | | 11/1998 | Hudson et al. ............. | 438/690 |
| 5,882,251 A | * | 3/1999 | Berman et al. ............. | 451/527 |
| 5,945,346 A | * | 8/1999 | Vanell et al. ............... | 438/691 |
| 5,972,792 A | | 10/1999 | Hudson ....................... | 438/691 |
| 6,030,899 A | | 2/2000 | Cook et al. ................. | 438/692 |
| 6,117,775 A | * | 9/2000 | Kondo et al. ............... | 438/690 |
| 6,135,865 A | * | 10/2000 | Beardsley et al. .......... | 451/285 |
| 6,162,368 A | | 12/2000 | Li et al. ....................... | 216/89 |

FOREIGN PATENT DOCUMENTS

JP         11-135466      *  5/1999    ......... H01L/21/304

* cited by examiner

Primary Examiner—Duy-Vu Deo
(74) Attorney, Agent, or Firm—Snell & Wilmer L.L.P.

(57) ABSTRACT

A process for removing a metallized surface from a workpiece is provided. A kinetic removal mechanism for removal of the metallized surface is characterized by a formation step for formation of a removable surface film and an abrasive step for removal of the film. The process includes causing the workpiece to contact a polishing surface while effecting relative motion between the workpiece and the polishing surface. The process also includes causing a polishing solution having less than 1 wt % of a polishing abrasive to be distributed at a contact area between the workpiece and the polishing surface so that the abrasive step is a rate-determining step of the removal mechanism.

56 Claims, 6 Drawing Sheets

APPARATUS AND PROCESS FOR POLISHING A WORKPIECE

TECHNICAL FIELD

The present invention relates, generally, to systems for polishing or planarizing workpieces, such as semiconductor wafers. More particularly, it relates to an improved method for planarizing a metallized surface on a workpiece.

BACKGROUND

The production of integrated circuits begins with the creation of high-quality semiconductor wafers. During the wafer fabrication process, the wafers may undergo multiple masking, etching, and dielectric and conductor deposition processes. In addition, metallization, which generally refers to the materials, methods and processes of wiring together or interconnecting the component parts of an integrated circuit located on the surface of a wafer, is critical to the operation of a semiconductor device. Typically, the "wiring" of an integrated circuit involves etching trenches and "vias" in a planar dielectric (insulator) layer and filling the trenches and vias with a metal.

In the past, aluminum was used extensively as a metallization material in semiconductor fabrication due to the leakage and adhesion problems experienced with the use of gold. Other metallization materials have included Ni, Ta, Ti, W, Ag, Cu/Al, TaN, TiN, CoWP, NiP and CoP. As the size of integrated circuit devices becomes smaller, architectural feature restrictions, such as line isolation and material resistivity, may limit performance of such devices. To meet the demands of small feature devices, the semiconductor industry is migrating to new materials and architectures. For example, the semiconductor industry has been moving to the use of copper for metallization due to the alloying and electromigration problems that are seen with aluminum. In addition, single and dual damascene architectures are being used to enhance electrical isolation of conducting wires. These architectures continue to evolve, and may be used in structures having less than 0.18 micron minimum feature dimensions. Further, to enhance performance speed possible with these new device architectures and smaller device features, lower dielectric constant materials (i.e., k<2.6) are being used to isolate conducting wires. However, such low dielectric constant materials exhibit characteristic porosity which reduces their mechanical strength, making them relatively fragile materials susceptible to shearing and crushing.

Because of the high degree of precision required in the production of integrated circuits, an extremely flat surface is generally needed on at least one side of the semiconductor wafer to optimize the fabrication process, as well as to ensure proper accuracy and performance of the microelectronic structures created on the wafer surface. As the size of copper damascene structures continues to decrease, such as to minimum feature dimensions no greater than 0.18 microns, non-uniformity due to density variations across a die must be minimized. Therefore, between each processing step, it is usually necessary to polish or planarize the surface of the wafer to obtain the flattest surface possible.

Chemical Mechanical Polishing ("CMP") machines have been developed to polish or planarize semiconductor wafer surfaces to the flat condition desired for integrated circuit components and the like. For examples of conventional CMP processes and machines, see U.S. Pat. No. 4,805,348, issued Feb. 21, 1989 to Arai et al.; U.S. Pat. No. 4,811,522, issued Mar. 14, 1989 to Gill; U.S. Pat. No. 5,099,614, issued Mar. 31, 1992 to Arai et al.; U.S. Pat. No. 5,329,732, issued Jul. 19, 1994 to Karlsrud et al.; U.S. Pat. No. 5,498,196, issued Mar. 12, 1996 to Karlsrud et al.; U.S. Pat. No. 5,498,199, issued Mar. 12, 1996 to Karlsrud et al.; U.S. Pat. No. 5,558,568, issued Sep. 24, 1996 to Talieh et al.; and U.S. Pat. No. 5,584,751, issued Dec. 17, 1996 to Kobayashi et al.

Typically, as illustrated in FIG. 1, a CMP machine 10 includes a wafer carrier 12 configured to hold, rotate, and transport a wafer 14 during the process of polishing or planarizing the wafer. The wafer carrier is rotated to cause relative lateral motion between the polishing surface and the wafer to produce a substantially uniform thickness. In general, the polishing surface includes a horizontal polishing pad 16, the hardness and density of which depend on the material that is to be polished and the degree of precision required in the polishing process. Polishing pad 16 is attached to a platen 18 which rotates, orbits, and/or dithers. During a polishing operation, the wafer is pressed against the polishing surface with a desired amount of "down force" such that the polishing surface exerts a desired amount of pressure against the surface of the wafer. The carrier and the polishing pad are rotated or orbited, typically at different velocities, to cause relative lateral motion between the polishing pad and the wafer to promote uniform polishing.

An abrasive slurry typically is applied to a top surface 20 of the polishing surface through a conduit 22 during polishing of the wafer. The abrasive slurry acts to chemically weaken the molecular bonds at the wafer surface so that the mechanical action of the polishing surface can remove the undesired material from the wafer surface. For example, slurries used for the CMP of a copper-alloy metallized surface typically comprise a solid abrasive and an oxidizing agent. The oxidizing agent acts to oxidize the metallized surface while the solid abrasive mechanically removes the metal oxide, which tends to be "softer" than the metallized surface, from the surface of the wafer.

The kinetic mechanism for the removal of a metallized surface of a wafer includes the formation of a removable surface film containing the metal and the removal of the film by an abrasive or "rubbing" action. The overall rate of removal of the metallized surface from a wafer is characterized by the rate of formation ($k_f$) of the removable surface film and the rate of abrasion ($k_a$) of the film. If the rate of formation is slower than the rate of abrasion, the formation of the surface film is the rate-determining step and removal of the metallized surface can proceed no faster than the formation of the surface film. If the rate of abrasion of the metallized surface is slower than the rate of formation of the surface film, abrasion of the surface film is the rate-determining step and removal of the metallized surface can proceed no faster than the abrasion. The rate of formation ($k_f$) is proportional to the volume and/or concentration of oxidizing agent that is available to the metallized surface for polishing and to the temperature of the system. Thus, if the distribution of polishing solution available to the metallized surface is increased, the rate of formation is increased. Similarly, if the temperature of the system is modified, for example, by suitably increasing or decreasing the temperature of the polishing solution, the rate of formation may be increased. The rate of abrasion ($k_a$) is dependent on various factors, such as, for example, the pressure applied to the metallized surface from the polishing surface, the velocity of the wafer relative to the polishing surface, and the size and shape of the abrasives contained in the polishing solution. If any one or more of these factors is changed, the rate of abrasion will change accordingly.

Typically for CMP using conventional abrasive slurries, the rate of removal of the metallized surface from the wafer at steady state may be characterized by Preston's Law:

RR=k*Pressure*Velocity for a given polishing solution, where "RR" is the rate of removal of the metallized surface, "Pressure" is the pressure applied to the metallized surface by the polishing surface, "Velocity" is the velocity at which the wafer moves relative to the polishing surface and "k" is a constant. Thus, as illustrated in FIG. 2, if the polishing solution composition and distribution and the velocity remain constant, rate of removal will be approximately proportional to the pressure across a range of pressures.

CMP may pose challenges when used for planarizing small device structures. For example, for devices having small feature dual damascene structures, CMP may remove large areas of copper residues but also result in the over-removal of small features. In addition, CMP may result in shearing and crushing of low dielectric constant materials. Capping films formed of materials tolerant to the CMP process are often adhered to the surface of low dielectric constant materials to protect such materials. However, the CMP process may cause cracks and loss of adhesion at the interface between the capping material and the low dielectric constant material. Further, abrasive slurries used in CMP may result in scratching of the wafer surface, oxide erosion, dishing and the creation of defects. The latter is particularly problematic for small structures, as a small defect will significantly jeopardize the performance of an even smaller device feature.

In addition, CMP may cause "edge effects" that reduce the die harvest from a wafer. As the wafer is pressed against the polishing pad, the pad deforms around the edge of the wafer, resulting in greater planarization at the wafer edge relative to the rest of the wafer. These edge effects are problematic as the semiconductor industry migrates from 200 mm wafers to 300 mm wafers. With more die around the edge of a, 300 mm wafer, edge effects will result in damage to a proportionately higher number of die of the 300 mm wafer compared to a 200 mm wafer.

To avoid at least some of these disadvantages, CMP may be performed at low down force pressures, that is, the wafer carrier exerts a relatively low down force when pressing the wafer against the polishing pad such that the wafer experiences a "low down force" pressure against the polishing pad. Typically, a "low down force" pressure range includes pressures of from about 0.10 psi to about 3.0 psi, and preferably includes pressures of from about 0.10 psi to about 1.0 psi.

In addition, abrasive-free, or relatively abrasive-free, polishing solutions have been used to planarize metallized surfaces on semiconductor wafers. Such polishing solutions typically have less than 1 wt % of polishing abrasives and are formed of oxidizers, such as hydrogen peroxide, which react with the metallized surface to form a removable surface film. Abrasive-free polishing solutions also are formed of agents that render the removable surface film water-soluble. An example of such a polishing solution is disclosed in U.S. Pat. No. 6,117,775, issued to Kondo et al. on Sep. 12, 2000, which patent is herein incorporated by reference. Polishing solutions having less than 1 wt % polishing abrasives have been shown to reduce scratching, dishing and oxide erosion. For convenience, abrasive-free and relatively abrasive-free polishing solutions, such as those having less than 1 wt % polishing abrasives, shall be collectively referred to herein as "abrasive-free polishing solutions."

While exhibiting distinct advantages, abrasive-free polishing solutions may fail to provide adequate rate of removal using conventional polishing pads and delivery mechanisms. Referring again to FIG. 1, a conventional polishing apparatus typically includes a polishing pad 16 with a uniform top surface 20 upon which a polishing solution is delivered via a conduit 22. While this conventional design may achieve acceptable rates of removal of the metal surface using an abrasive slurry, because of the chemically-reactive nature of abrasive-free polishing solutions, this conventional design does not provide for uniform distribution of the abrasive-free solution to the contact area between the wafer and the polishing pad. The wafer typically acts like a "squeegee" preventing even distribution of fresh slurry across the wafer. Thus, the rate of formation of the removable surface film is the rate-determining step of the planarization mechanism.

The disadvantage is particularly problematic for CMP processes that require a low down force pressure of the wafer against the polishing pad. The relationship between the rate of removal and pressure applied to the wafer by the polishing pad for conventional CMP apparatus using abrasive-free polishing solutions is illustrated in FIG. 3. As illustrated in FIG. 3, a "critical down force" point, shown as point A, of non-Prestonian behavior exists, below which rates of removal are not satisfactorily proportional to the applied pressure. At low down force pressure ranges, as depicted between pressure $P_1$ and pressure $P_2$, rates of removal are unacceptably low. Accordingly, for devices requiring low down force CMP processing, such as those formed of low dielectric materials, throughput is decreased as a result of the increase in processing time required to remove the metallized surface. In addition, low down force pressures may result in within-die nonuniformity. Further, because the polishing solution is not uniformly distributed over the surface of the wafer, non-uniform planarization results.

A need therefore exists for a process and an apparatus for improving planarization of metallized surfaces of workpieces using abrasive-free polishing solutions. A need further exists for a process and an apparatus for improving planarization of metallized surfaces using abrasive-free polishing solutions wherein the rate-determining step of the metal removal mechanism of the planarization process is the abrasion of the metallized surface. In addition, a need exists for a process and any apparatus for improving the planarization of copper surfaces wherein the rate of removal of copper from a copper surface of the workpiece is approximately proportional to the pressure at which the workpiece contacts the polishing surface, where the pressure is within a low down force pressure range.

SUMMARY OF INVENTION

These and other aspects of the present invention will become more apparent to those skilled in the art from the following non-limiting detailed description of preferred embodiments of the invention taken with reference to the accompanying figures.

In accordance with an exemplary embodiment of the present invention, a process of removing a metallized surface from a workpiece is provided. A kinetic removal mechanism for removal of the metallized surface is characterized by a formation step for formation of a removable surface film and an abrasive step for removal of the surface film. The process includes causing the workpiece to contact a polishing surface while effecting relative motion between the workpiece and the polishing surface. The process also includes causing a polishing solution having less than 1 wt % of a polishing abrasive to be distributed at a contact area between the workpiece and the polishing surface so that the abrasive step is a rate-determining step of the removal mechanism.

In another exemplary embodiment, the process includes establishing a temperature at a contact area between the workpiece and the polishing surface so that the abrasive step is the rate-determining step of the removal mechanism.

In accordance with a further exemplary embodiment, an apparatus for removing a metallized surface from a workpiece is provided. A kinetic removal mechanism for removal of the metallized surface is characterized by a formation step for formation of a removable surface film and an abrasive step for removal of the surface film. The abrasive step is the rate-determining step of the removal mechanism. The apparatus includes a source of a polishing solution having less than 1 wt % of a polishing abrasive and a polishing member. A polishing solution delivery assembly is configured to deliver the polishing solution to the polishing member. A workpiece carrier is configured to carry the workpiece and press the workpiece against the polishing member. A drive assembly is configured to effect relative motion between the workpiece and the polishing member.

In accordance with another exemplary embodiment, a process for removing a copper surface from a workpiece having single and/or dual damascene structures is provided, wherein the workpiece contacts a polishing member at a contact pressure. The process includes causing a polishing solution to be distributed at a contact area between the workpiece and the polishing member so that a rate of removal of the copper surface is approximately proportional to the contact pressure within a range of contact pressures, wherein the range of contact pressures comprises a low down force pressure.

In a further exemplary embodiment, a process for removing a copper surface from a workpiece having single and/or dual damascene structures is provided. The workpiece contacts a polishing member at a contact pressure. The process includes causing a polishing solution having less than 1 wt % of a polishing abrasive to be distributed at a contact area between the workpiece and the polishing member so that a rate of removal of the copper surface is approximately proportional to the contact pressure within a range of contact pressures, wherein the range of the contact pressures includes a low down force pressure.

In accordance with yet another exemplary embodiment, an apparatus for removing a copper surface from a workpiece having single and/or dual damascene structures is provided. The apparatus includes a source of a polishing solution, a polishing member and a workpiece carrier configured to carry the workpiece and to press the workpiece against the polishing member at a contact pressure. A drive assembly is configured to effect relative motion between the workpiece and the polishing member. A polishing solution distribution assembly is configured to distribute the polishing solution at a contact area between the workpiece and the polishing member so that a rate of removal of the copper surface is approximately proportional to the contact pressure along a range of contact pressures, wherein the range of contact pressures comprises a low down force pressure.

In accordance with yet a further exemplary embodiment, an apparatus for removing a copper surface from a workpiece having single and/or dual damascene structures is provided. The apparatus includes a source of a polishing solution having less than 1 wt % of a polishing abrasive and a polishing member. A workpiece carrier is configured to carry the workpiece and to press the workpiece against the polishing member at a contact pressure. A drive assembly is configured to effect relative motion between the workpiece and the polishing pad. A polishing solution distribution assembly is configured to distribute the polishing solution at a contact area between the workpiece and the polishing member so that a rate of removal of the copper surface is approximately proportional to the contact pressure along a range of contact pressures, wherein the range of contact pressures comprises a low down force pressure.

BRIEF DESCRIPTION OF THE DRAWINGS

Exemplary embodiments of the present invention will hereafter be described in conjunction with the appended drawing figures, wherein like designations denote like elements, and.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
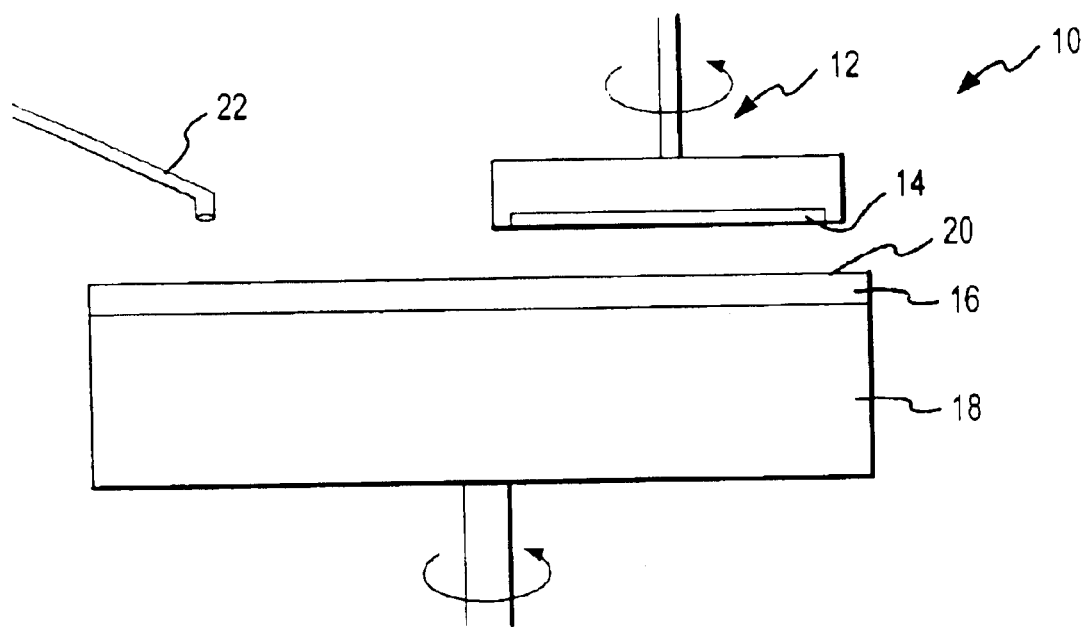
FIG. 1 is a cross-sectional view of a polishing pad and platen known in the art.
Figure 2:
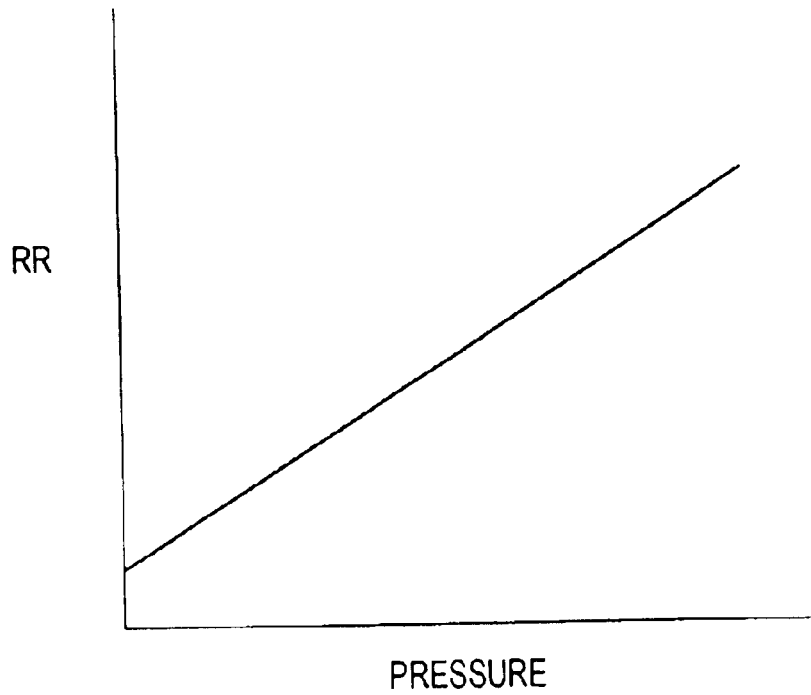
FIG. 2 is a graphical illustration of the change of the rate of removal of a metallized surface on a wafer with the change in relative pressure between the wafer and a polishing surface in a conventional chemical mechanical planarization process.
Figure 3:
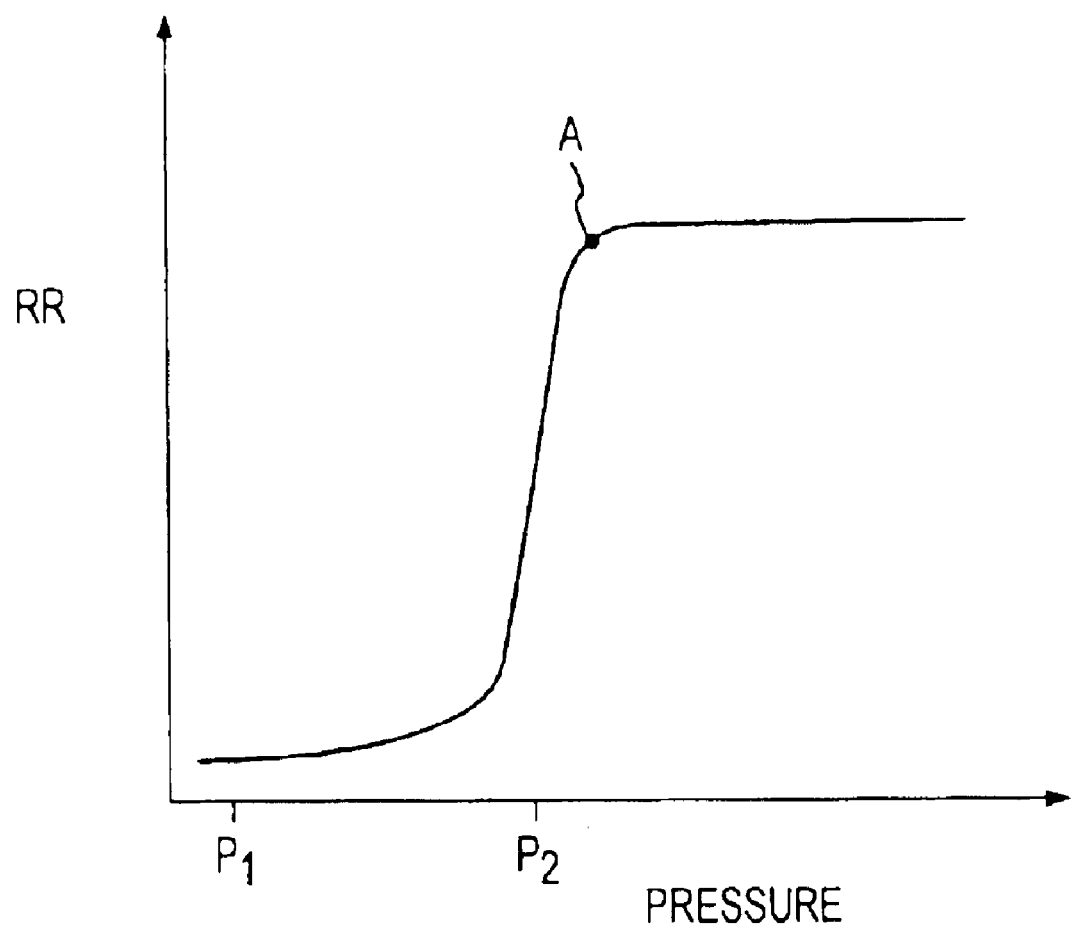
FIG. 3 is a graphical illustration of the change of the rate of removal of a metallized surface on a wafer with the change in relative pressure between the wafer and a polishing surface in a chemical mechanical planarization process in which an abrasive-free polishing solution is used.
Figure 4:
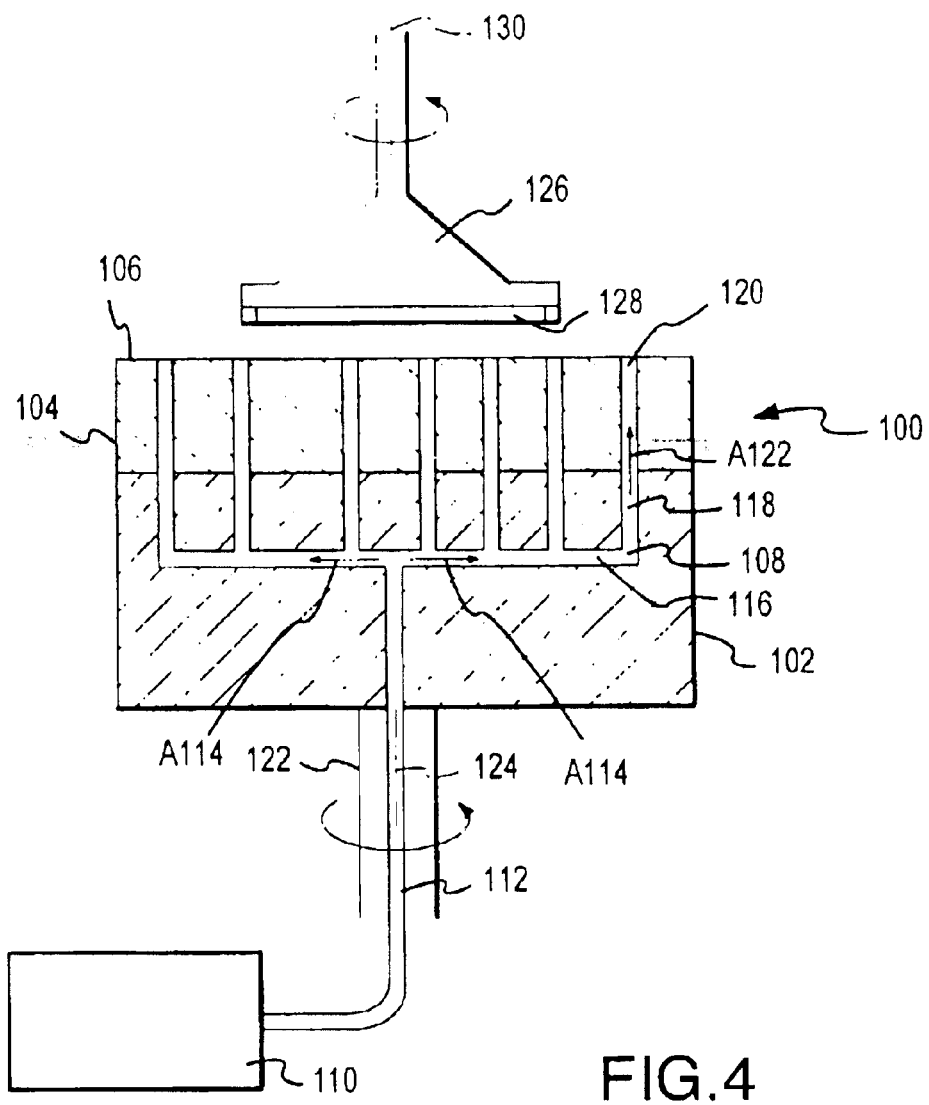
FIG. 4 is a cross-sectional view of a polishing station which utilizes an abrasive-free polishing solution, in accordance with an exemplary embodiment of the present invention.
Figure 5:
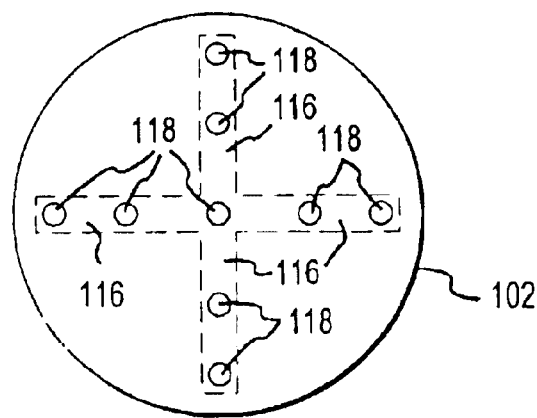
FIG. 5 is a top view of a platen of the polishing station of FIG. 4.

A schematic representation of an exemplary embodiment of a polishing station 100 of the present invention is shown in FIGS. 4 and 5. As herein described, polishing station 100 is configured to provide uniform and adequate distribution of an abrasive-free polishing solution so that the metallized surface of a subject workpiece readily forms a removable surface film, thereby make the abrasion step of the planarization mechanism the rate-determining step. Polishing station 100 is suitable for planarizing workpieces having metallized surfaces and is particularly suitable for planarizing workpieces having copper metallization. Such workpieces include those having single and dual damascene structures, such as, for example, those having minimum feature dimensions no greater than 0.18 microns. In addition, polishing station 100 is suitable for planarizing workpieces formed of low dielectric constant materials, such as, for example, those materials having a dielectric constant less than or equal to 2.6.

Polishing station 100 includes a polishing platen 102. A polishing pad 104 with a polishing surface 106 is mounted to the platen 102. A wafer carrier 126 holds a workpiece 128, such as a semiconductor wafer, which has a metallized surface. Wafer carrier 126 is configured to press the workpiece against polishing surface 106 while relative motion between workpiece 128 and polishing surface 106 is effected. In one embodiment, wafer carrier 126 may rotate workpiece 128 about an axis 130. In another embodiment, wafer carrier 126 may move workpiece 128 linearly or orbitally relative to polishing surface 106. Workpiece 126 may press workpiece 128 against polishing surface 106 with a predetermined down force so that workpiece 126 experiences a down force pressure against the polishing surface. When workpiece 126 is formed of low dielectric constant materials, it may be desirable to limit this pressure to a "low down force" pressure range. This "low down force" pressure range may include pressures within the range of from about 0.10 psi to about 3.0 psi, but preferably within a range of from about 0.10 psi to about 1.0 psi.

In one embodiment of the invention, an abrasive-free polishing solution is delivered to polishing surface 106 of pad 104 by a manifold apparatus 108. A pump 110 may distribute the solution through a fluid line 112 and through distribution manifold 108 to one or more conduits 116 formed within platen 102 in the direction indicated by arrows A114. Conduits 116 allow for easy transportation of the abrasive-free polishing solution through platen 102. The abrasive-free polishing solution may then suitably flow from conduits 116 through one or more bores 118 in the direction of arrows A122. Platen 102 is connected to a shaft 122 that is connected to a drive assembly (not shown) to rotate platen 102 and pad 104 around axis 124. Polishing station 100 may employ suitable rotary unions (not shown), rotary couplings (not shown) and the like to permit rotation around axis 124. Alternatively, it will be appreciated that the drive assembly may be operative to move platen 102 and polishing pad 104 in an orbital, linear or oscillatory pattern or any combination of orbital, linear, oscillatory and rotary patterns. Referring again to FIG. 4, polishing pad 104 similarly has one or more channels 120 that permit the abrasive-free polishing solution to flow from bores 118 of platen 102 to the pad surface. Channels 120 may be molded into pad 104 when originally fabricated or may be machined into pad 104. Through bores 118 and channels 120, the polishing solution may flow from conduits 116 to the surface 106 of pad 104.

Figure 6:
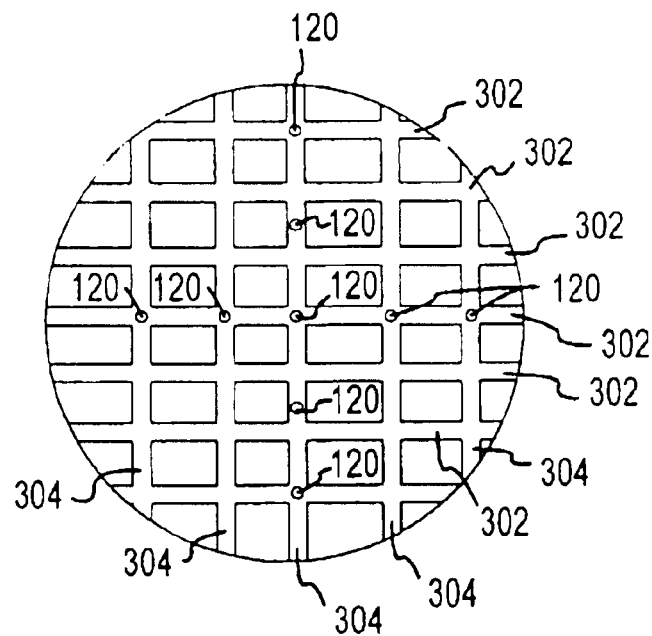
FIG. 6 is a top view of a polishing pad used in a polishing station which utilizes an abrasive-free polishing solution, in accordance with another exemplary embodiment of the present invention.

In another embodiment, as illustrated in FIG. 6, polishing pad 104 as referenced in FIG. 4, may also be scored with grooves running in the "x" and "y" directions to form a grid with parallel x-direction grooves 302 and crossing perpendicular grooves 304. Grooves 302 and 304 may intersect channels 120 of pad 104. Grooves 302 and 304 assist in the distribution of the abrasive-free polishing solution during planarization. As the workpiece is pressed against the polishing pad during planarization, grooves 302 and 304 permit the abrasive-free fluid to flow across the surface of the wafer and serve to reduce or eliminate the "squeegee" effect that conventional polishing pads experience during planarization. While grooves 302 and 304 are shown in a perpendicular relationship, it will be appreciated that polishing pad 104 may comprise grooves of any suitable pattern that is configured to facilitate uniform distribution of fresh polishing solution.

Figure 7:
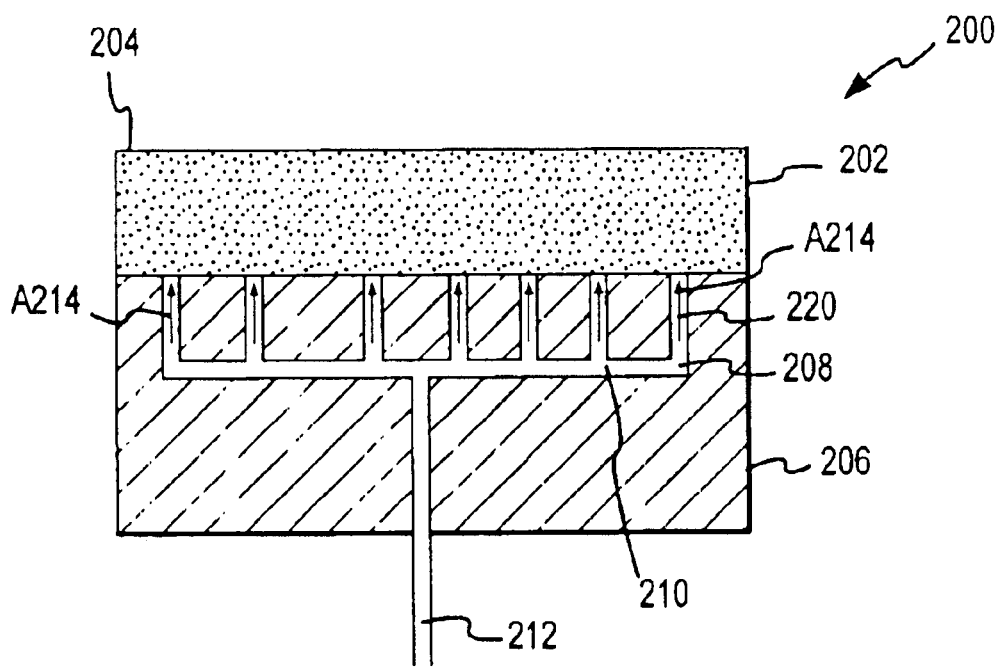
FIG. 7 is a cross-sectional view of a polishing station which utilizes an abrasive-free polishing solution, in accordance with another exemplary embodiment of the present invention.

In an alternative embodiment, a polishing station 200 utilizes a porous polishing pad 202. Referring to FIG. 7, an abrasive-free polishing solution may be delivered to a polishing surface 204 of a polishing pad 202 from a manifold apparatus 208 formed in a rotating platen 206. The abrasive-free polishing solution is delivered under pressure through a fluid line 212 connected to a solution source (not shown) to manifold apparatus 208 having one or more conduits 210 formed within platen 206. The abrasive-free polishing solution may then suitably flow from conduits 210 through one or more bores 220 in the direction of arrows A214. The abrasive-free polishing solution then flows through the pores of pad 202 under pressure so as to be evenly distributed to polishing surface 204.

In a further embodiment, polishing pad 202 may be scored with grooves running in the "x" and "y" directions to form a grid with parallel x-direction grooves (not shown) and crossing perpendicular y-direction grooves (not shown). These grooves facilitate uniform distribution across the surface of polishing pad 202 of the abrasive-free polishing solution that flows through the pores of the pad. Alternatively, the grooves may be formed in any suitable pattern that facilitates distribution of fresh polishing solution.

It will be appreciated that the above described grooved polishing pads may also be used in CMP apparatus with conventional slurry delivery systems wherein the polishing slurry is deposited on the top surface of the polishing pad, rather than through the polishing pad as described above. When the slurry is deposited on the top surface of the polishing pad, the grooves serve to uniformly distribute the slurry on the top of the pad to facilitate planarization.

A method for planarization using one embodiment of the invention will now be described. Referring again to FIG. 4, wafer carrier 126 urges wafer 128 against polishing pad 104 such that wafer 128 engages polishing pad 104 at a desired pressure. The pressure exerted by wafer carrier 126 may be any pressure suitable for planarizing a workpiece and may comprise a "low-down force" pressure suitable for planarizing workpieces formed of fragile low dielectric-constant materials. An abrasive-free polishing solution is pumped by pump 110 through fluid line 112 to distribution manifold 108. From distribution manifold 108, the abrasive-free polishing solution flows through conduits 116 and bores 118 of platen 102 and channels 120 of polishing pad 104 to the polishing surface 106. Using this method, fresh abrasive-free polishing solution is distributed uniformly to the metallized surface of workpiece 128. Wafer carrier 126 and workpiece 128 may rotate about axis 130 while platen 102 and polishing pad 104 move in a rotational, orbital or linear pattern. In addition, wafer carrier 126 and workpiece 128 may oscillate relative to polishing pad 104. As the abrasive-free polishing solution uniformly contacts workpiece 128, a removable surface film containing the metal is formed on the metallized surface. The removable surface film is subsequently uniformly removed by the mechanical abrasive action of polishing surface 106 of polishing pad 104. In this manner, the rate of formation of the removable surface film on the metallized surface by the polishing solution is increased, making abrasion the rate-determining step of the metal removal mechanism. Accordingly, the rate of removal of the metallized surface is approximately proportional to the pressure experienced by the wafer from the polishing surface, even when the pressure is a low down force pressure.

In another embodiment, removable surface film formation may be facilitated by modifying the temperature during planarization. In an exemplary embodiment of the present invention, the abrasive-free polishing solution may be heated before being delivered to the manifold apparatus. In another embodiment, the temperature of the planarization process may be increased by providing a heated fluid to the backside of the workpiece. Apparatus for exposing a heat exchange fluid to the backside of a wafer are well known in the art. For an example of an apparatus configured to regulate the polishing rate of a wafer by backside fluid exposure, see U.S. Pat. No. 5,606,488, issued to Ohashi et al. on Feb. 25, 1997, which patent is herein incorporated by reference. Similarly, planarization may be facilitated by decreasing the temperature of the system. For example, the abrasive-free polishing solution may be cooled before being delivered to the manifold apparatus. In another embodiment, the temperature of the planarization process may be decreased by providing a cooled fluid to the backside of the workpiece.

Figure 8:
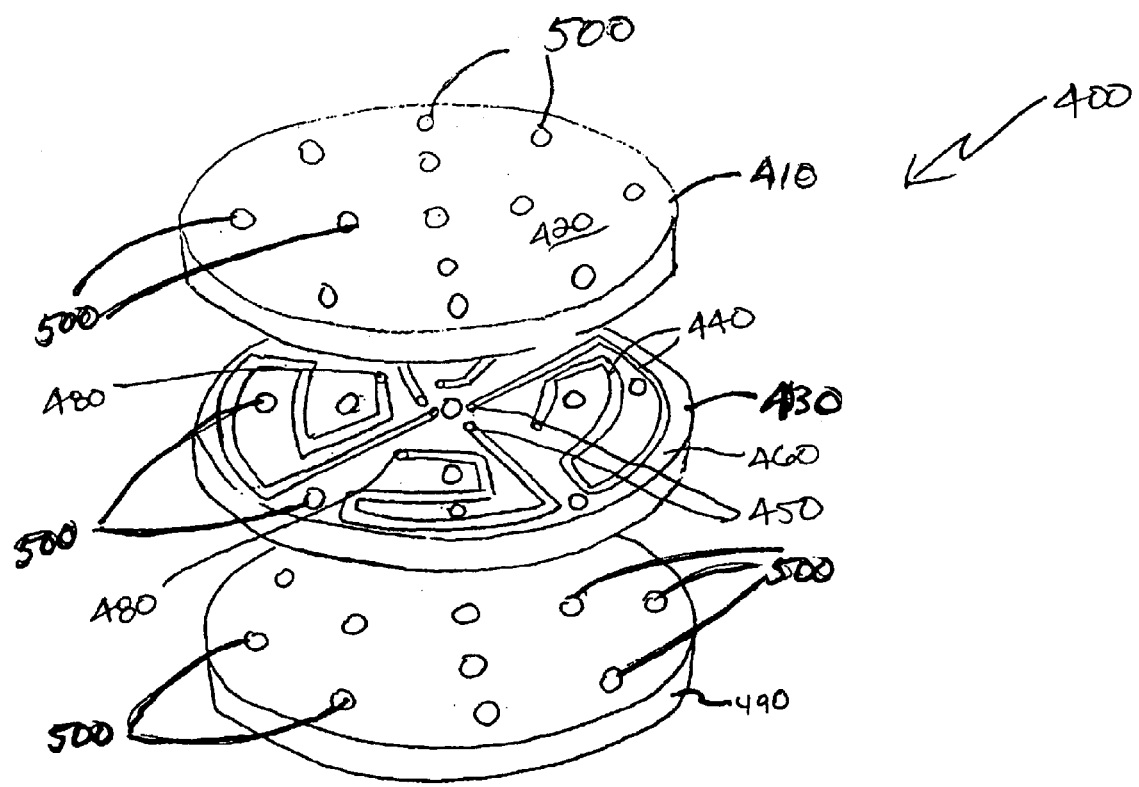
FIG. 8 is an exploded perspective view of a platen in accordance with another exemplary embodiment of the present invention.

The temperature of the planarization process may also be regulated by providing a heat conductivity platen configured to be temperature controlled by a heat exchange fluid circulating therethrough. Although there are a number of methods to fabricate such a platen, only one of those methods is illustrated herein. Referring to FIG. 8, in accordance with one embodiment of the invention, a platen 400 is fabricated from a material having a high thermal conduction coefficient to facilitate control of the processing temperature. Platen 400 may be constructed in three pieces that are connected together by belts, rivets, or, preferably, by brazing to form a unitary platen. Platen 400, in this embodiment, is formed from a substantially circular cover plate 410 that has a substantially planar upper surface 420 to which a polishing pad can be attached, for example, with an adhesive. In this embodiment, platen 400 further includes a channel section 430 that includes channel grooves 440. Preferably, channel grooves 440 are configured in a serpentine pattern. A heat exchange fluid flows from inlets 450 near the center or axis of platen 400 to a location near the periphery 460 of the platen and then, in a serpentine pattern to exits 480 again located near the center or axis of platen 400. Platen 400 is completed by a bottom section 490 that includes on its bottom surface (not shown) a configuration for the attachment of the platen to a platen shaft.

In an alternative method (not illustrated) for fabricating platen 400, the channel groove could be formed in the underside of the cover plate. The channel groove then could be sealed by attaching a circular disk having a planar top surface to the underside of the cover plate. The bottom section could then be attached to the circular disk, or, alternatively, the function of the circular disk and the bottom section could be combined. In either this method or the illustrated method, a channel groove through which a heat exchange fluid can be circulated is formed beneath the substantially planar surface of the platen assembly.

Cover plate 410, channel section 430 and bottom section 490 each have a first set of bores 500, similar to bores 118 as referenced in FIG. 4, through which an abrasive-free polishing solution may flow. Bores 500 in cover plate 410 are colinear with bores 500 in channel section 430, which in turn are colinear with bores 500 in bottom section 490. A manifold apparatus (not shown) may be connected to bottom section 490 to deliver the polishing solution through bores 500 of the bottom section, channel section and cover plate to the polishing pad.

Figure 9:
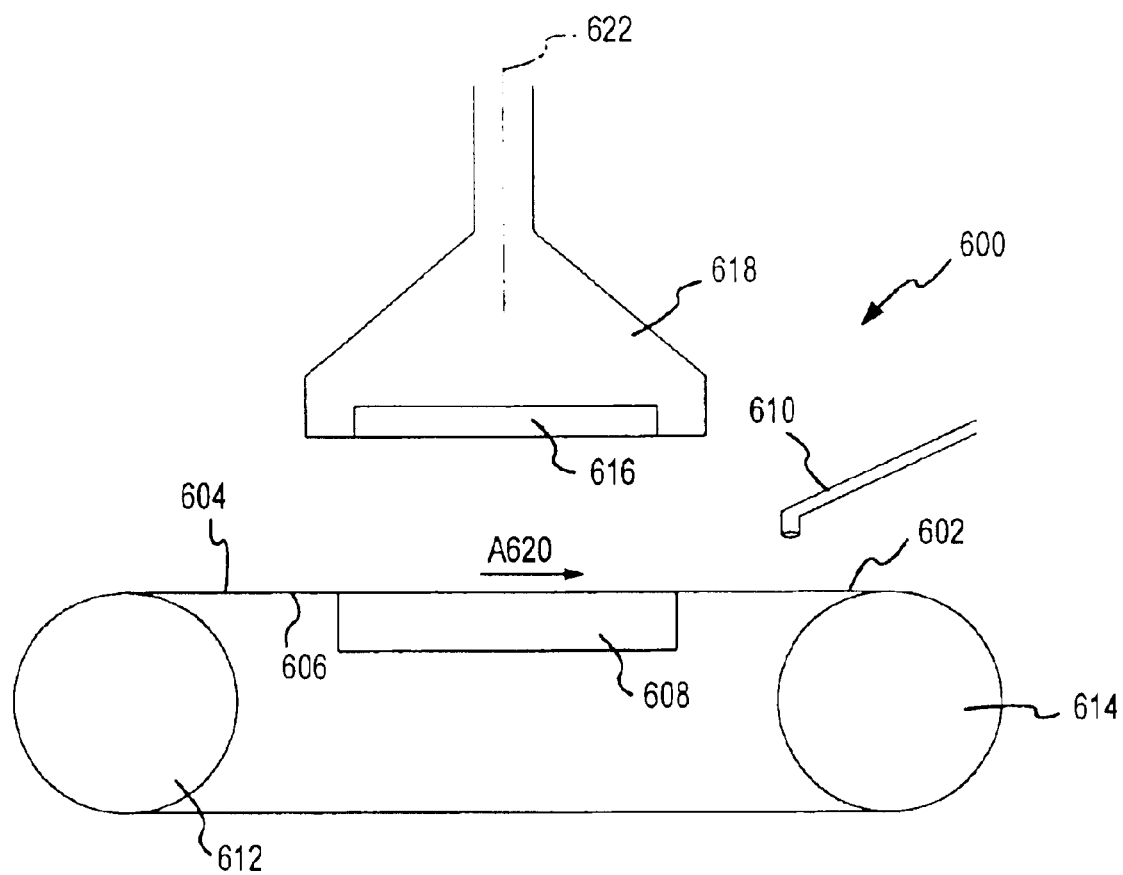
FIG. 9 is a cross-sectional view of a polishing station which utilizes an abrasive-free polishing solution, in accordance with another exemplary embodiment of the present invention.

FIG. 9 illustrates another polishing station 600 that is configured to provide uniform and adequate distribution of an abrasive-free polishing solution. An endless belt 602 is provided with at least one side of belt 602 having a polishing surface 604. Belt 602 rotates about rollers 612 and 614, which rollers are driven by a drive motor assembly (not shown) so that the rotational motion of rollers 612 and 614 cause belt 602 to be driven in a linear motion, as shown by arrow A620, with respect to a workpiece 616 held by a wafer carrier 618. Belt 602 preferably has a smooth opposite surface 606 that may be laid across and supported by a supporting surface 608. The minimum width of the belt 602 is dependent on the size of a workpiece 616 to be planarized. An abrasive-free polishing solution may be applied through a conduit 610 via a fluid pump (not shown). During planarization, workpiece carrier 618 presses workpiece 616 against polishing surface 604 with a desired pressure, while rotating workpiece 616 about an axis 622.

Figure 10:
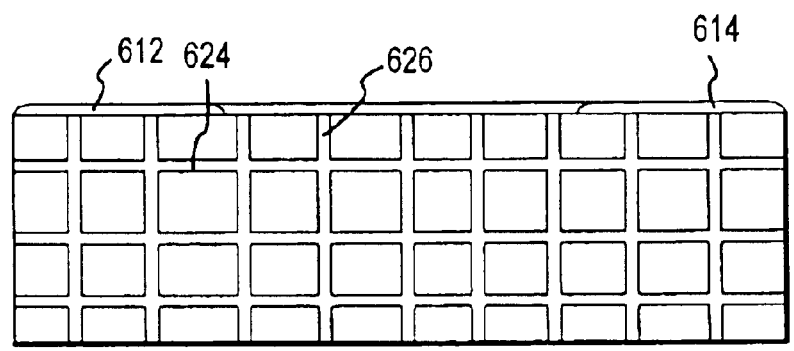
FIG. 10 is a top view of a polishing surface of the polishing station illustrated in FIG. 9.

In an exemplary embodiment of the present invention, the polishing surface 604 may be scored with grooves to facilitate distribution of fresh polishing solution to the surface of the workpiece so that abrasion of metal oxide on a metallized surface of workpiece 616 is the rate-determining step of the removal mechanism. As illustrated in FIG. 10, the grooves may be scored in the "x" and "y" directions to form a grid with x-direction grooves 624 and crossing perpendicular y-direction grooves 626. While grooves 624 and 626 are shown in FIG. 10 as perpendicular "x"- and "y"-direction grooves, it will be appreciated that the grooves may be formed in any suitable pattern that facilitates distribution of the abrasive-free polishing solution.

Linear polishing station 600 also may use a temperature control mechanism to increase or decrease the temperature of the planarization process so that abrasion, and not removable surface film formation, is the rate-determining step of the removal mechanism. In one embodiment the abrasive-free polishing solution may be heated before being delivered to conduit 610. In another embodiment, as described above, the temperature of the planarization process may be changed by providing a heated fluid to the backside of the wafer.

Using the above various embodiments, the rate of removal of a metallized surface during a planarization process using an abrasive-free polishing solution is facilitated. By using the above embodiments, the metallized surface of a workpiece may be readily formed to a removable surface film by the polishing solution so that abrasion of the metallized surface is the rate-determining step of the planarization process. Further, the rate of removal of the metal from the workpiece is approximately proportional to the pressure exerted against the workpiece by the polishing surface, even within low down force pressure ranges. Thus, expeditious and uniform planarization of the workpiece is achieved, even when the workpiece is pressed against the polishing pad at low pressures.

While the above-described embodiments are directed to planarization of a metallized surface using an abrasive-free slurry, it will be appreciated that one or more of the embodiments may also be incorporated in CMP apparatus that utilize abrasive slurries. By working in conjunction with the abrasive particles of the abrasive slurry, the embodiments may be useful in facilitating the rate of removal of the metallized surface.

In the foregoing specification, the invention has been described with reference to specific embodiments. However, it may be appreciated that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be constructed as critical, required, or essential features or elements of any or all of the claims. As used herein, the terms "comprises," "comprising" and any other variation thereof are intended to cover a non-exclusive inclusion, such that a process, method, article, or apparatus that comprises a list of elements does not include only those elements but may include other elements not expressly listed or inherent to such process, method, article or apparatus.

We claim:

1. A process for removing a metallized surface from a workpiece, wherein a kinetic removal mechanism for removal of said metallized surface is characterized by a formation step for formation of a removable surface film surface and an abrasive step for removal of said film, said process comprising:

causing said workpiece to contact a polishing member while effecting relative motion between said workpiece and said polishing member;

causing a polishing solution having less than 1 wt % of a polishing abrasive to be distributed at a contact area between said workpiece and said polishing member through at least one bore formed in a platen connected to said polishing member to affect a removal rate for removal of said film during said abrasive step;

establishing a temperature at said contact area by heating or cooling said polishing solution before causing said polishing solution to be distributed to said contact area; and controlling the temperature at said contact area by circulating a heat exchange fluid through at least a portion of said platen.

2. The process of claim 1, wherein said causing comprises supplying said polishing solution to said contact area through a plurality of pores formed in said polishing member.

3. The process of claim 2, further comprising forming on said polishing member a plurality of grooves that are configured to facilitate distribution of said polishing solution.

4. The process of claim 3, wherein said forming comprises forming pa plurality of first grooves configured in parallel relation and forming a plurality of second grooves configured in parallel relation, and wherein said plurality of first grooves is configured perpendicular to said plurality of second grooves.

5. The process of claim 1, wherein said causing comprises supplying said polishing solution to said contact area through at least one channel formed in said polishing member.

6. The process of claim 5, wherein said causing further comprises supplying said polishing solution to said polishing member through at least one bore formed in a platen connected to said polishing member, wherein said at least one bore is collinear with said at least one channel.

7. The process of claim 5, further comprising forming on said polishing member a plurality of grooves that are configured to facilitate distribution of said polishing solution.

8. The process of claim 7, wherein said forming comprises forming said plurality of grooves so that said at least one channel intersects at least one of said plurality of grooves.

9. The process of claim 7, wherein said forming comprises forming a plurality of first grooves configured in parallel relation and forming a plurality of second grooves configured in parallel relation, and wherein said plurality of first grooves is configured perpendicular to said plurality of second grooves.

10. The process of claim 1, further comprising forming on said polishing member a plurality of grooves that are configured to facilitate distribution of said polishing solution.

11. The process of claim 10, wherein said forming comprises forming a plurality of first grooves configured in parallel relation and forming a plurality of second grooves configured in parallel relation, and wherein said plurality of first grooves is configured perpendicular to said plurality of second grooves.

12. The process of claim 1, wherein said causing said workpiece to contact a polishing member comprises causing said workpiece to contact a polishing member at a low down force pressure.

13. The process of claim 12, wherein said causing said workpiece to contact a polishing member at a low down force pressure comprises causing said workpiece to contact a polishing member at a pressure within a range of from about 0.10 psi to about 3.0 psi.

14. The process of claim 13, wherein said causing said workpiece to contact a polishing member at a low down force pressure comprises causing said workpiece to contact a polishing member at a pressure within a range of from about 0.10 psi to about 1.0 psi.

15. A process for removing a metallized surface from a workpiece, wherein a kinetic removal mechanism for removal of said metallized surface is characterized by a formation step for formation of a removable surface film and an abrasive step for removal of said film, said process comprising:

pressing said workpiece against a polishing member while effecting relative motion between said workpiece and said polishing member;

causing a polishing solution having less than 1 wt % of a polishing abrasive to be distributed to a contact area between said workpiece and said polishing member through at least one bore formed in a platen connected to said polishing member; and establishing a temperature at said contact area while said polishing solution is distributed to said contact area to affect a removal rate for removal of said film during said abrasive step by heating and or cooling said polishing solution before causing said polishing solution to be distributed to said contact area and controlling the temperature at said contact area by circulating a heat exchange fluid through at least a portion of said platen.

16. The process of claim 15, wherein said causing comprises supplying said polishing solution to said contact area through a plurality of pores formed in the polishing member.

17. The process of claim 16, further comprising forming on said polishing surface a plurality of grooves that are configured to facilitate distribution of said polishing solution.

18. The process of claim 17, wherein said forming comprises forming a plurality of first grooves configured in parallel relation and forming a plurality of second grooves configured in parallel relation, and wherein said plurality of first grooves is configured perpendicular to said plurality of second grooves.

19. The process of claim 15, wherein said causing comprises supplying said polishing solution to said contact area through at least one channel formed in said polishing member.

20. The process of claim 19, wherein said causing further comprises supplying said polishing solution to said polishing member through at least one bore formed in a platen connected to said polishing member, wherein said at least one bore is collinear with said at least one channel.

21. The process of claim 19, further comprising forming on said polishing surface a plurality of grooves that are configured to facilitate distribution of said polishing solution.

22. The process of claim 21, wherein said forming comprises forming said plurality of grooves so that said at least one channel intersects at least one of said plurality of grooves.

23. The process of claim 21, wherein said forming comprises forming a plurality of first grooves configured in parallel relation and forming a plurality of second grooves configured in parallel relation, and wherein said plurality of first grooves is configured perpendicular to said plurality of second grooves.

24. A process for removing a copper surface from a workpiece having at least one of single damascene structures and dual damascene structures, wherein the workpiece contacts a polishing member at a contact pressure, said process comprising:

causing a polishing solution to be distributed at a contact area between said workpiece and said polishing member through at least one bore formed in a platen connected to said polishing member so that a rate of removal of said copper surface is approximately proportional to said contact pressure within a range of contact pressures, wherein said range of contact pressures comprises a low-down force pressure; and establishing a temperature at said contact area by heating or cooling said polishing solution before causing said polishing solution to be distributed to said contact area and controlling the temperature at said contact area by circulating a heat exchange fluid through at least a portion of said platen.

25. The process of claim 24, wherein said causing said polishing solution to be distributed comprises supplying said polishing solution to said contact area through a plurality of pores formed in the polishing member.

26. The process of claim 25, further comprising forming on said polishing member a plurality of grooves that are configured to facilitate distribution of said polishing solution.

27. The process of claim 26, wherein said forming comprises forming a plurality of first grooves configured in parallel relation and forming a plurality of second grooves configured in parallel relation, and wherein said plurality of first grooves is configured perpendicular to said plurality of second grooves.

28. The process of claim 24, wherein said causing said polishing solution to be distributed comprises supplying said polishing solution to said contact area through at least one channel formed in said polishing member.

29. The process of claim 28, wherein said causing further comprises supplying said polishing solution to said polishing member through at least one bore formed in a platen connected to said polishing member, wherein said at least one bore is collinear with said at least one channel.

30. The process of claim 28, further comprising forming on said polishing member a plurality of grooves that are configured to facilitate distribution of said polishing solution.

31. The process of claim 30, wherein said forming comprises forming said plurality of grooves so that said at least one channel intersects at least one of said plurality of grooves.

32. The process of claim 30, wherein said forming comprises forming a plurality of first grooves configured in parallel relation and forming a plurality of second grooves configured in parallel relation, and wherein said plurality of first grooves is configured perpendicular to said plurality of second grooves.

33. The process of claim 24, further comprising forming on said polishing member a plurality of grooves that are configured to facilitate distribution of said polishing solution.

34. The process of claim 33, wherein said forming comprises forming a plurality of first grooves configured in parallel relation and forming a plurality of second grooves configured in parallel relation, and wherein said plurality of first grooves is configured perpendicular to said plurality of second grooves.

35. The process of claim 24, wherein said process for removing a copper surface from a workpiece having at least one of single damascene structures and dual damascene structures comprises a process for removing a copper surface from a workpiece having damascene structures with minimum feature dimensions no greater than 0.18 microns.

36. The process of claim 35, wherein said process for removing a copper surface from a workpiece having at least one of single damascene structures and dual damascene structures comprises a process for removing a copper surface from a workpiece formed of low dielectric constant materials.

37. The process of claim 35, wherein said cawing comprises causing a polishing solution to be distributed at a contact area between said workpiece and said polishing member so that a rate of removal of said copper surface is approximately proportional to said contact pressure within a range of contact pressures, wherein said range of contact pressures comprises a low down force pressure in a range of from about 0.10 psi to about 3.0 psi.

38. The process of claim 24, wherein said process for removing a copper surface from a workpiece having at least one of single damascene structures and dual damascene structures comprises a process for removing a copper surface from a workpiece formed of low dielectric constant materials.

39. The process of claim 24, wherein said polishing solution has less than 1 wt % of a polishing abrasive.

40. The process of claim 24, wherein said causing comprises causing a polishing solution to be distributed at a contact area between said workpiece and said polishing member so that a rate of removal of said copper surface is approximately proportional to said contact pressure within a range of contact pressures, wherein said range of contact pressures comprises a low down force pressure in a range of from about 0.10 psi to about 3.0 psi.

41. A process for removing a copper surface from a workpiece having at least one of a single damascene structures and dual damascene structures, wherein the workpiece contacts a polishing member at a contact pressure, said process comprising:

causing a polishing solution having less than 1 wt % of a polishing abrasive to be distributed at a contact area between said workpiece and said polishing member through at least one bore formed in a platen connected to said polishing member so that a rate of removal of said copper surface is approximately proportional to said contact pressure within a range of contact pressures, wherein said range of contact pressures comprises a low down force pressure; and establishing a temperature at said contact area by heating or cooling said polishing solution before causing said polishing solution to be distributed to said contact area and controlling the temperature at said contact area by circulating a heat exchange fluid through at least a portion of said platen.

42. The process of claim 41, wherein said causing said polishing solution to be distributed comprises supplying said polishing solution to said contact area through a plurality of pores formed in the polishing member.

43. The process of claim 42, further comprising forming on said polishing member a plurality of grooves that are configured to facilitate distribution of said polishing solution.

44. The process of claim 43, wherein said forming comprises forming a plurality of first grooves configured in parallel relation and forming a plurality of second grooves configured in parallel relation, and wherein said plurality of first grooves is configured perpendicular to said plurality of second grooves.

45. The process of claim 41, wherein said causing said polishing solution to be distributed comprises supplying said polishing solution to said contact area through at least one channel formed in said polishing member.

46. The process of claim 45, wherein said causing further comprises supplying said polishing solution to said polishing member through at least one bore formed in a platen connected to said polishing member, wherein said at least one bore is collinear with said at least one channel.

47. The process of claim 45, further comprising forming on said polishing member a plurality of grooves that are configured to facilitate distribution of said polishing solution.

48. The process of claim 47, wherein said forming comprises forming said plurality of grooves so that said at least one channel intersects at least one of said plurality of grooves.

49. The process of claim 47, wherein said forming comprises forming a plurality of first grooves configured in parallel relation and forming a plurality of second grooves configured in parallel relation, and wherein said plurality of first grooves is configured perpendicular to said plurality of second grooves.

50. The process of claim 41, further comprising forming on said polishing member a plurality of grooves that are configured to facilitate distribution of said polishing solution.

51. The process of claim 50, wherein said forming comprises forming a plurality of first grooves configured in parallel relation and forming a plurality of second grooves configured in parallel relation, and wherein said plurality of first grooves is configured perpendicular to said plurality of second grooves.

52. The process of claim 41, wherein said process for removing a copper surface from a workpiece having at least one of single damascene structures and dual damascene structures comprises a process for removing a copper surface from a workpiece having damascene structures with minimum feature dimensions no greater than 0.18 microns.

53. The process of claim 52, wherein said process for removing a copper surface from a workpiece having at least one of single damascene structures and dual damascene structures comprises a process for removing a copper surface from a workpiece formed of low dielectric constant materials.

54. The process of claim 52, wherein said causing comprises causing a polishing solution having less than 1 wt % of a polishing abrasive to be distributed at a contact area between said workpiece and said polishing member so that a rate of removal of said copper surface is approximately proportional to said contact pressure within a range of contact pressures, wherein said range of contact pressures comprises a low down force pressure in a range of from about 0.10 psi to about 3.0 psi.

55. The process of claim 41, wherein said process for removing a copper surface from a workpiece having at least one of single damascene structures and dual damascene structures comprises a process for removing a copper surface from a workpiece formed of low dielectric constant materials.

56. The process of claim 41, wherein said causing comprises causing a polishing solution having less than 1 wt % of a polishing abrasive to be distributed at a contact area between said workpiece and said polishing member so that a rate of removal of said copper surface is approximately proportional to said contact pressure within a range of contact pressures, wherein said range of contact pressures comprises a low down force pressure in a range of from about 0.10 psi to about 3.0 psi.

* * * * *